United States Patent
Young et al.

(10) Patent No.: US 7,354,851 B2
(45) Date of Patent: Apr. 8, 2008

(54) METHOD FOR FABRICATING SEMICONDUCTOR DEVICE

(75) Inventors: Rex Young, Hsinchu (TW); Pin-Yao Wang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 138 days.

(21) Appl. No.: 11/161,080

(22) Filed: Jul. 22, 2005

(65) Prior Publication Data

US 2006/0166499 A1   Jul. 27, 2006

(30) Foreign Application Priority Data

Jan. 7, 2005   (TW) .............................. 94100439 A

(51) Int. Cl.
*H01L 21/4763* (2006.01)
(52) U.S. Cl. ...................... 438/622; 438/620; 438/637; 438/672; 438/E21.582
(58) Field of Classification Search ................ 438/259, 438/637, 672–673
See application file for complete search history.

(56) References Cited

U.S. PATENT DOCUMENTS

2002/0192960 A1\* 12/2002 Hillyer et al. .............. 438/689
2005/0142845 A1\*  6/2005 Lee et al ..................... 438/622
2006/0128085 A1\*  6/2006 Shibib et al. ................ 438/197

OTHER PUBLICATIONS

Titled "Characterization of Thin Oxide Removal by Rapid Thermal Annealing Treatment" by Hashim et al. in Nov. 1998 in Bangi, Malaysia. pp. 213-216 offered by IEEE.

\* cited by examiner

*Primary Examiner*—Dung A. Le
(74) *Attorney, Agent, or Firm*—Jianq Chyun IP Office

(57) ABSTRACT

A method for fabricating a semiconductor device is described. The method includes providing a substrate having a trench therein, and a trench device in the trench. The trench device includes two gate structures disposed on the sidewalls of the trench, a doped region in the substrate between the gate structures and an inter-gate dielectric layer disposed on the surface of the gate structures. A thermal treatment process in a nitrogen-containing ambient is performed to remove the native oxide layer formed on the surface of the doped region. Then, a conductive layer is formed to fill in the trench.

6 Claims, 5 Drawing Sheets

METHOD FOR FABRICATING SEMICONDUCTOR DEVICE

CROSS-REFERENCE TO RELATED APPLICATION

This application claims the priority benefit of Taiwan application serial no. 94100439, filed on Jan. 7, 2005. All disclosure of the Taiwan application is incorporated herein by reference.

BACKGROUND OF THE INVENTION

1. Field of Invention

The present invention relates to a semiconductor process; more particularly, to a method for fabricating a semiconductor device.

2. Description of Related Art

In an ordinary integrated circuit processing, the photolithography and etching technology is commonly used for forming an opening or a trench, for example, in a silicon substrate or a material containing silicon. It is well known in the art that, when the wafer is waiting to be delivered to the next chamber after the opening or the trench to be formed in the silicon substrate or the material containing silicon, the silicon substrate or the material containing silicon at the bottom of the opening or the trench is exposed to an oxygen-containing ambient, for example, oxygen or vapor. Therefore, the silicon atoms in the silicon substrate or the material containing silicon may react with oxygen or vapor in an oxidation reaction to form a silicon dioxide layer, which is also known as a native oxide layer. The formation of the above native oxide layer generates many problems for the subsequent processing. For example, the native oxide layer may increase the resistance at the contact point and reduce the electrical connection performance. Thus, the yield and the reliability of the device are compromised.

Ordinarily, the method for eliminating the native oxide layer is to apply a wet cleaning technique or an in-situ plasma treatment, etc. The above wet cleaning technique utilizes a hydrofluoric acid (HF) solution to eliminate the native oxide layer, and the process is tedious and time-consumable. In addition, the above in-situ plasma treatment may induce damages on the silicon substrate or the material containing silicon at the bottom of the opening or the trench, while the native oxide layer, which eventually leads to a reduction of the yield of and the reliability of the products, is being removed, .

For much of the trench devices, a native oxide layer is formed at the bottom of the wafer due to an exposure to the oxygen-containing ambient before filling the trench with a conductive layer. The native oxide layer may generate many problems for the processing, thereby reducing the yield and reliability of the devices.

SUMMARY OF THE INVENTION

In view of the prior art described above, it is an object of the present invention to provide a method for fabricating a semiconductor device, in which problems such as poor performance of the devices, low process yield and device reliability can be avoided.

Another object of the present invention is to provide a method for fabricating a semiconductor device, in which the native oxide layer can be eliminated to improve the yield and the reliability of the product.

The present invention provides a method for fabricating a semiconductor device. The method includes forming a trench at the bottom of the substrate. A first thermal treatment process in a nitrogen-containing ambient is performed to remove a first native oxide layer formed on the surface of the trench. A conductive layer is further formed to fill in the trench.

According to one exemplary embodiment of the present invention, the above method for fabricating a semiconductor device further includes forming a buffer layer before the formation of the conductive layer. Thereafter, a second thermal treatment process in a nitrogen-containing ambient is performed to remove a second native oxide layer formed on the surface of the buffer layer.

According to the exemplary embodiment of the present invention, the above the first thermal treatment process and the second thermal treatment process include a rapid thermal anneal process.

According to the exemplary embodiment of the present invention, the heating temperature of the above first thermal treatment process and the second thermal treatment process is in a range of about 700-1000° C.

According to the exemplary embodiment of the present invention, the heating time of the above first thermal treatment process and second thermal treatment process is in a range of about 30-90 second.

According to the exemplary embodiment of the present invention, the material of the above conductive layer comprises doped polysilicon. In addition, the method for forming the conductive layer includes chemical vapor deposition (CVD).

According to the exemplary embodiment of the present invention, the material of the above buffer layer comprises undoped polysilicon.

The present invention provides another method for fabricating a semiconductor device. In this method, a substrate which has a trench therein is first provided, wherein a trench device is formed in the trench in advance. The trench device comprises two gate structures disposed on the sidewalls of the trench, a doped region in the substrate between the two gate structures and an inter-gate dielectric layer disposed on the surface of the gate structures. Thereafter, a thermal treatment process in a nitrogen-containing ambient is performed to remove a first native oxide layer formed on the surface of the doped region. A conductive layer is then formed to fill in the trench.

According to the exemplary embodiment of the present invention, each of the above two gate structures comprises a gate disposed on the sidewalls of the trench and a tunneling oxide layer disposed between the gate and the substrate, respectively. In addition, the above gate is floating gate, while the doped region is a source region, and the conductive layer is a source line.

The present invention performs a thermal treatment in a nitrogen-containing ambient to eliminate the native oxide layer, so as to avoid the problems of undesirable performance of the devices, which further affects the, yield and reliability of the production. Moreover, the present invention may form a buffer layer before the formation of the conductive layer to decrease the aspect ratio so that problems, such as poor step coverage and voids formation in the conductive layer can be prevented.

These and other exemplary embodiments, features, aspects, and advantages of the present invention will be described and become more apparent from the detailed description of exemplary embodiments when read in conjunction with accompanying drawings.

DETAILED DESCRIPTION OF THE PREFERRED EMBODIMENT

One of the embodiments of the present invention will be described below to explain the method for fabricating semiconductor device by illustrating the formation of a memory cell with a trench capacitor. However, the present invention is not limited to this embodiment.

FIG. 1A to FIG. 1D are schematic, cross-sectional views showing the process flow of the method for fabricating semiconductor device in accordance with one embodiment of the present invention.

Figure 1A:
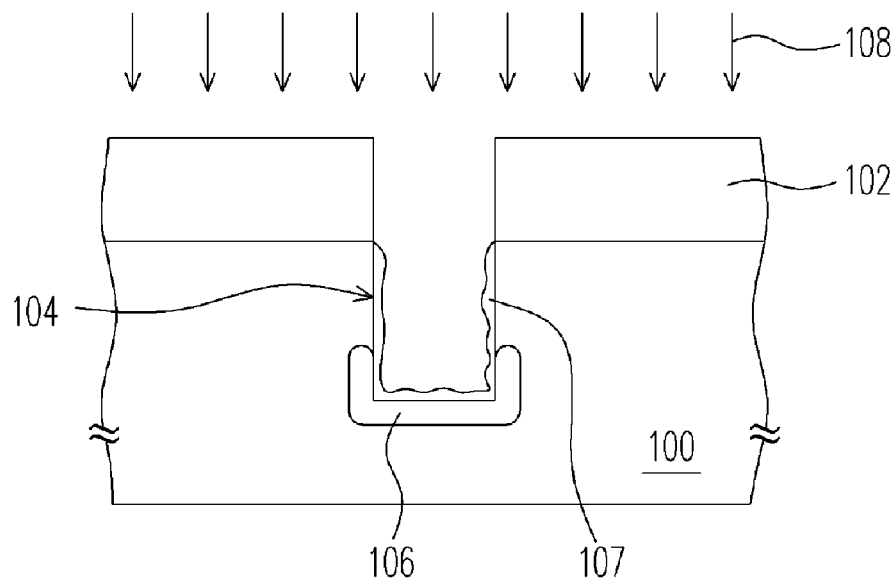
FIG. 1A to FIG. 1D are schematic, cross-sectional views showing the process flow of the method for fabricating a semiconductor device according to one embodiment of the present invention.

Referring to FIG. 1A, a patterned mask layer 102 is formed on a substrate 100, wherein the material of the patterned mask layer 102 can be, for example, silicon nitride. The steps for forming the patterned mask layer 102 include, for example, forming a mask material layer (not shown in the drawings) by chemical vapor deposition (CVD) to cover the substrate 100, followed by a photolithographing process and a etching process to form patterns in the mask material layer.

Thereafter, the patterned mask layer 102 is used as a mask, and an etching process is performed to form a trench 104 in the substrate 100. The method for forming the trench 104 in substrate 100 is, for example, dry etching. Then, a doped region 106 serving as a storage electrode of a trench capacitor is formed at the bottom of the trench 104. At this time, the wafer may be exposed to an oxygen containing ambient (i.e., oxygen or vapor) before performing the next process. Therefore, a native oxide layer may be formed on the part of the wafer exposed to the oxygen containing ambient. For example, the silicon atoms at the surface of the trench 104 may react with oxygen or vapor in an oxidation reaction to form a native oxide layer 107.

A thermal treatment process 108 in a nitrogen containing ambient is performed to remove the native oxide layer 107, wherein the thermal treatment process 108 is, for example, a rapid thermal anneal process. The heating temperature of the thermal treatment process 108 is in a range of about 700-1000° C., while the heating time is in a range of about 30-90 seconds. The principle for eliminating the native oxide layer 107 is to utilize nitrogen to catalyze the native oxide layer 107, which is transformed into silicon monoxide to be evaporated. Thereby, the native oxide layer 107 is eliminated. Furthermore, nitrogen can suppress the oxidation of the silicon substrate or materials containing silicon. Therefore, while eliminating the native oxide layer 107, nitrogen may be used to prevent silicon atoms from reacting with oxygen atoms in an oxidation reaction to form silicon dioxide.

Figure 1B:
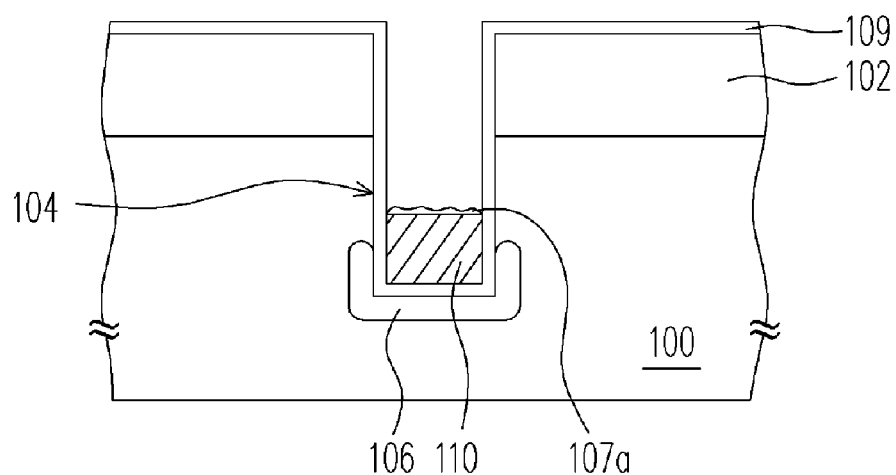

Then, referring to FIG. 1B, a buffer layer 110 is formed in the trench 104, wherein the material of the buffer layer 110 includes, but not limited to, undoped polysilicon. The steps of forming the buffer layer include, for example, forming an undoped polysilicon silicon layer (not shown in the drawings) to fully fill the trench 104, followed by performing an etching process to remove a part of the undoped polysilicon layer. A buffer layer 110 is subsequently formed in the trench 104.

The buffer layer 110 can decrease the aspect ratio so as to avoid the problems of poor step coverage and voids formation in the conductive layer that subsequently fills the trench 104. A reduction of the yield and the reliability of the production can also be obviated. In addition, a dielectric layer 109 may also be formed at the surface of the trench 104 before the formation of the buffer layer 110, wherein the material of the dielectric layer 109 includes, for example, silicon oxide or silicon nitride. The dielectric layer 109 is formed by, for example, thermal oxidation or low-pressure chemical vapor deposition. Similarly, the surface of the buffer layer 110 may be exposed to an oxygen-containing ambient, and a native oxide layer 107a is formed before the following process is performed.

Figure 1C:
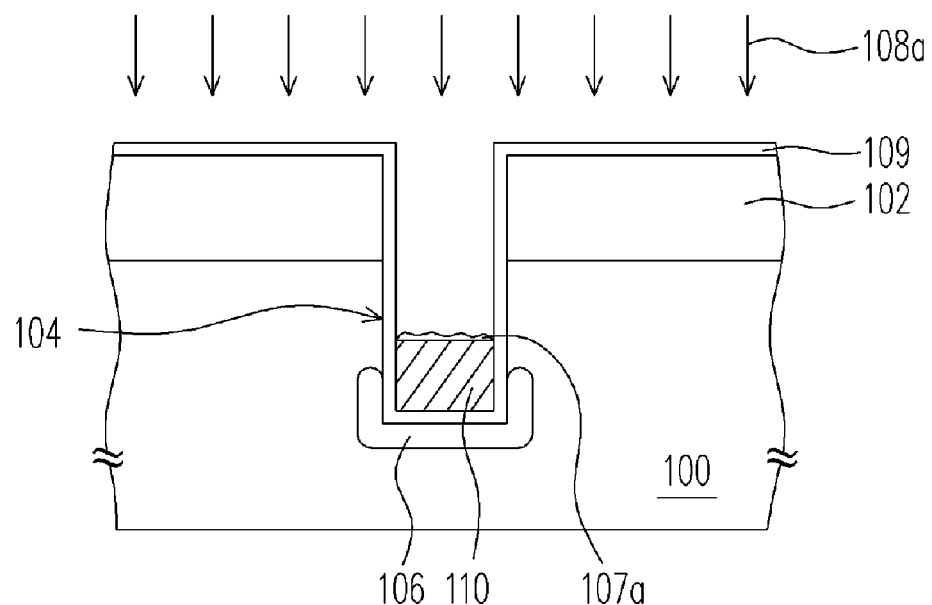

Then, referring to FIG. 1C, a thermal treatment process 108a in a nitrogen containing ambient is performed to remove the native oxide layer 107a, wherein the thermal treatment process 108a is, for example, a rapid thermal anneal process. The heating temperature of the thermal treatment 108a is in a range of about 700-1000° C., and the heating time is in a range of about 30-90 seconds. The principle of the above method of performing a thermal treatment process 108a in a nitrogen-containing ambient to eliminate the native oxide layer 107a is similar to that to eliminate the native oxide layer 107.

Figure 1D:
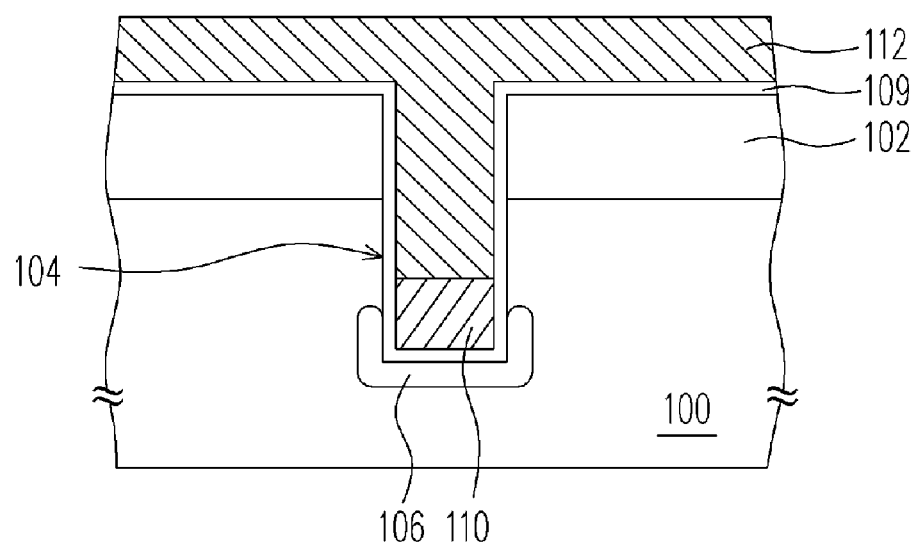

Continuing to FIG. 1D, a conductive layer 112 is formed to fully fill the trench 104, wherein the material of the conductive layer 112 is, for example, doped polysilicon. The method of forming the conductive layer 112 is chemical vapor deposition, for example.

Thereafter, the related processes to form a memory cell with a trench capacitor can be further performed to form the requisite parts, such as an upper electrode (not shown in the drawings), a source region (not shown in the drawings), a drain region (not shown in the drawings), a gate (not shown in the drawings), etc., to complete the fabrication of the memory cell. As these processes are well-known to those skilled in the art, a detailed description thereof will be omitted.

Another embodiment of the present invention will be described below to explain the method for fabricating a semiconductor device by illustrating the formation of a flash memory cell. However, the present invention is not limited to this embodiment.

FIG. 2A to FIG. 2E are schematic, cross-sectional views showing the process flow of the method for fabricating a semiconductor device according to another embodiment of the present invention.

Figure 2A:
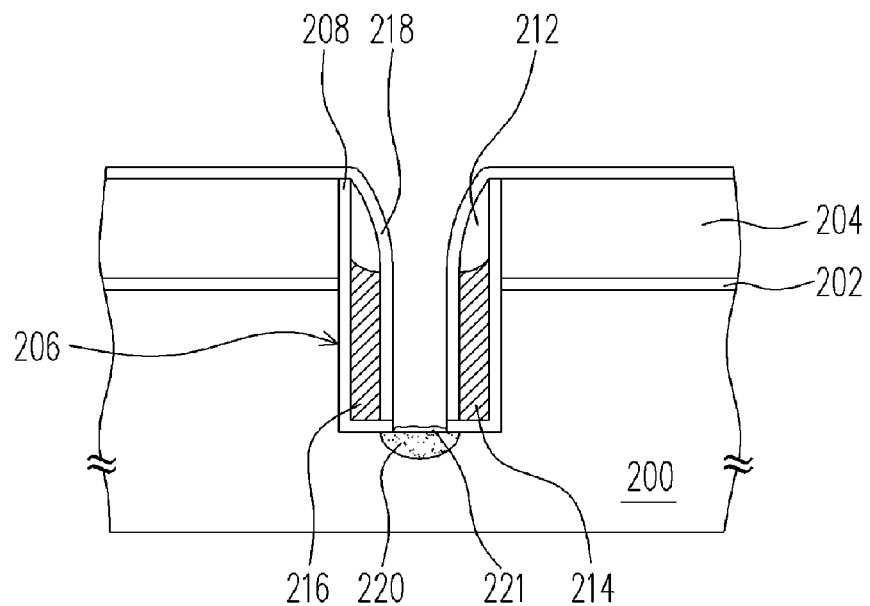
FIG. 2A to FIG. 2E are schematic, cross-sectional views showing the process flow of the method for fabricating a semiconductor device according to another embodiment of the present invention.

Referring to FIG. 2A, a pad layer 202 and a mask layer 204 are formed on substrate 200 in sequence, and a trench 206 is formed in the pad layer 202, the mask layer 204 and a part of the substrate 200. A trench device is further formed in the trench 206, wherein the method of the form the trench device includes but not limited to forming a tunneling oxide layer 208 on the surface of the trench 206, followed by filling the trench 206 with a conductive material layer (not shown in the drawings) with the top higher than the surface of the pad layer 202 and lower than the surface of the mask layer 204. The upper surface of the conductive material layer is a concave arc surface. A pair of spacers 212 is then formed on the sidewalls of the trench 206 covering a part of the conductive material layer. The spacers 212 and the mask layer 204 serve as a mask for removing a part of the conductive material layer to form a floating gate 214 and a floating gate 216 on the sidewalls of the trench 206. The above floating gate 214 and the adjacent tunneling oxide layer 208, and the floating gate 216 and the adjacent tunneling oxide layer 208 form a gate structure, respectively.

Then, an inter-gate dielectric layer 218 is formed on the surface of the mask layer 204, the spacers 212, the tunneling oxide layer 208, the floating gate 214 and the floating gate 216. With the inter-gate dielectric layer 218 serving as a mask, a part of the tunneling oxide layer 208 is removed to expose a part of the substrate 200 at the bottom of the trench 206. Thereafter, a doped region 220 is formed in the substrate 200 at the bottom of the trench 206, wherein the doped region 220 is, for example, a source region, and its formation method includes an ion plantation process, for example. The above two gate structures (for example the floating gate 214 and the adjacent tunneling oxide layer 208, and the floating gate 216 and the adjacent tunneling oxide layer 208) positioned on the sidewalls of the trench 206, the doped region 220 and the inter-gate dielectric layer 218 form a trench device.

At this time, the wafer may be exposed to an oxygen containing ambient (for example, oxygen or vapor) before the subsequent process is performed. Thus, as it is known, the surface of the doped region 220 may be oxidized easily to form a native oxide layer 221 by oxygen or vapor in the ambient.

Figure 2B:
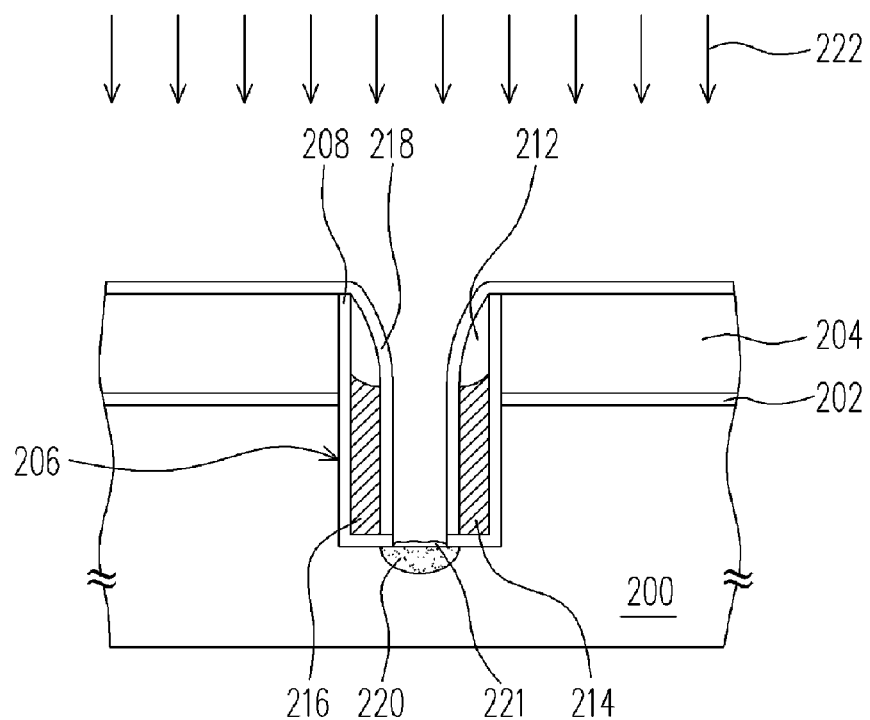

Continuing to FIG. 2B, a thermal treatment process 222 in a nitrogen containing environment is performed to remove the native oxide layer 221, wherein the thermal treatment process 222 includes, for example, a rapid thermal anneal process. The heating temperature of the thermal treatment process 222 is in a range of about 700-1000° C., and the heating time is in a range of about 30-90 seconds. The principle of the above method for eliminating the native oxide layer 221 is to utilize nitrogen to catalyze the native oxide layer 221, which is transformed into silicon monoxide to be evaporated. The native oxide layer 221 is thereby eliminated. Furthermore, nitrogen can suppress any oxidation of the silicon substrate and materials containing silicon. Therefore, while eliminating the native oxide layer 221, nitrogen may be used to prevent silicon atoms from reacting with oxygen atoms in an oxidation reaction to form silicon dioxide.

Figure 2C:
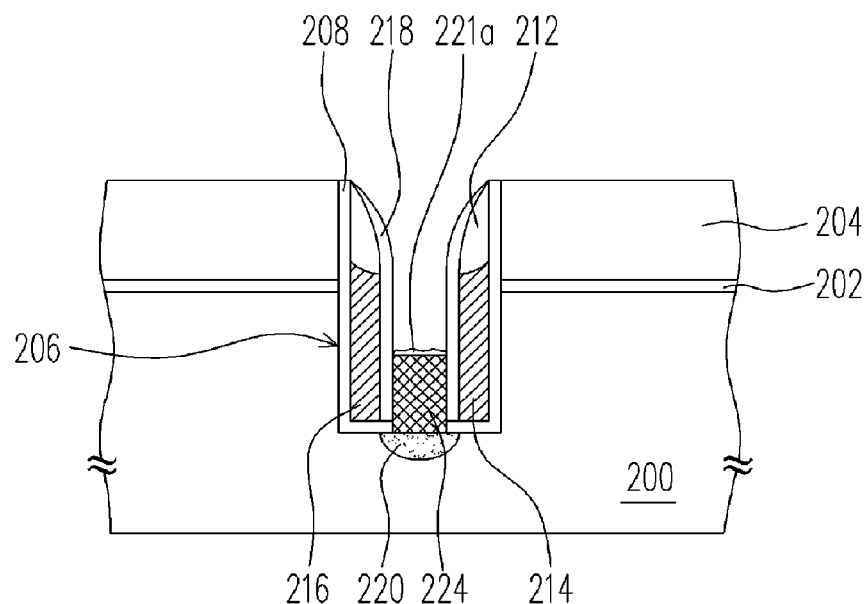

Then, referring the FIG. 2C, an undoped polysilicon layer (not shown in the drawings) is formed to fully fill the trench 206. A part of undoped polysilicon layer is further removed and a buffer layer 224 is formed in the trench 206. At the same time, a part of the inter-gate dielectric layer 218 is removed to expose the surface of the mask layer 204, wherein the surface of the buffer layer 224 is lower than the surface of the pad layer 202. In this embodiment, the buffer layer 224 can decrease the aspect ratio so as to avoid the problem of poor step coverage and the formation of voids in the conductive layer that subsequently fills the trench 206.

Similarly, the surface of the buffer layer 224 may be exposed to an oxygen-containing ambient and be oxidized by oxygen or vapor to form a native oxide layer 221a before a subsequent process is performed.

Figure 2D:
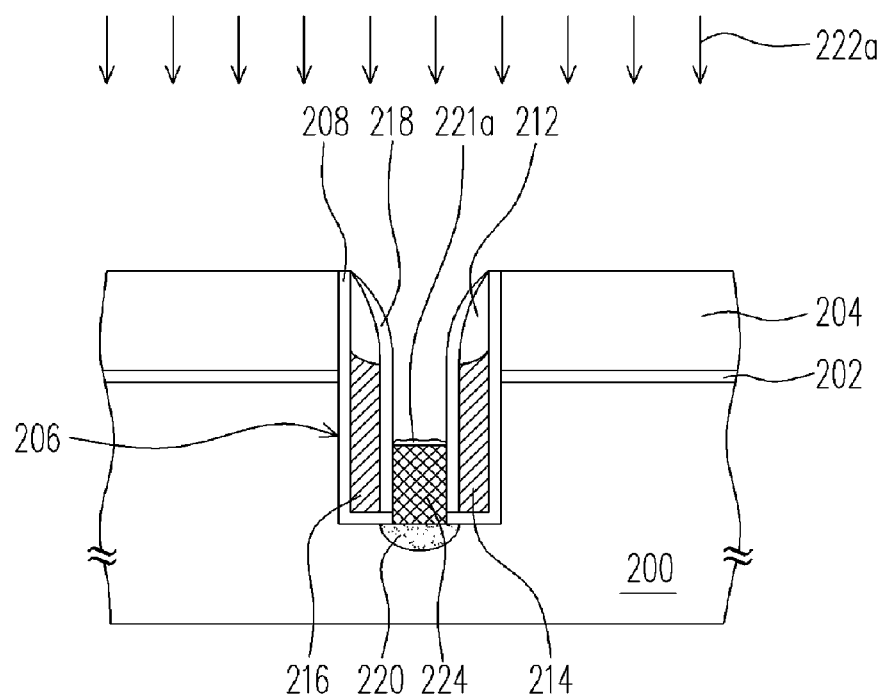

Referring to FIG. 2D, a thermal treatment process 222a in a nitrogen-containing ambient is performed to remove the native oxide layer 221a, wherein the thermal treatment process 222a is, for example, a rapid thermal anneal process. The heating temperature of the thermal treatment process 222a is in a range of about 700-1000° C., and the heating time is in a range of about 30-90 seconds. The principle of the above method of performing a thermal treatment process 222a in a nitrogen-containing ambient to eliminate the native oxide layer 221a is the same as that to eliminate the native oxide layer 221.

Figure 2E:
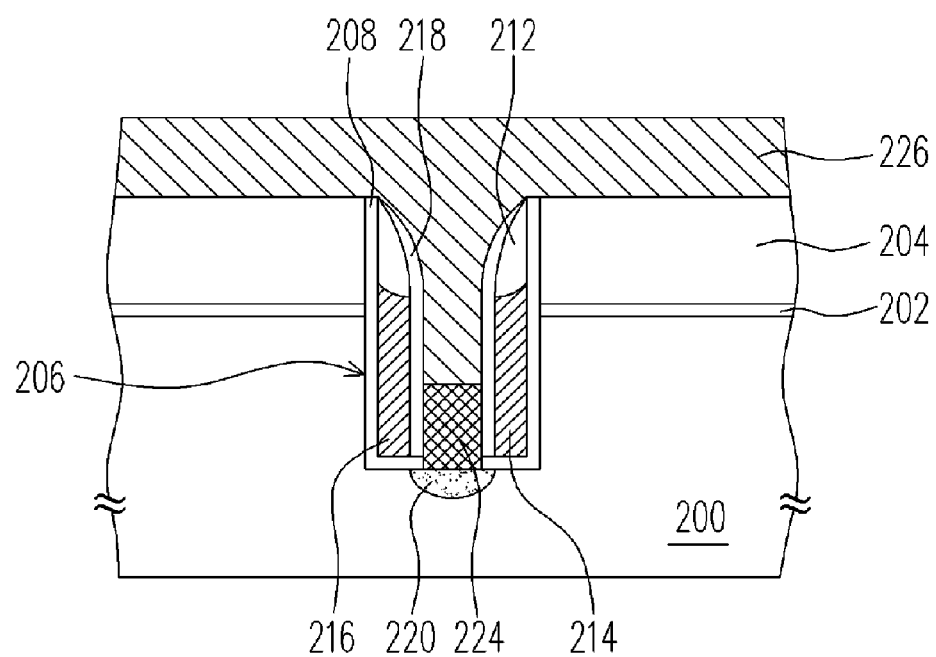

Continuing to FIG. 2E, a conductive layer 226 is formed on the top of the substrate 200 to cover a patterned mask layer 204 and to fill the trench 206, wherein a material of the conductive layer 226 is, for example, doped amorphous silicon, which is formed by, for example, chemical vapor deposition. The above conductive layer 226 may be used as a source line.

Thereafter, the related processes to fabricate the flash memory cell can be further performed. As these processes can be understood easily by those skilled in the art, a detailed description thereof will be omitted.

In summary, the present invention provides a thermal treatment in a nitrogen-containing ambient to eliminate the native oxide layer, so as to avoid the problem of bad performance of the devices, which may further influence the yield and the reliability of the production. Furthermore, the present invention may form a buffer layer (reference 110 indicated in FIG. 1F and reference 224 indicated in FIG. 2D) before the formation of the conductive layer (reference 112 indicated in FIG. 1D and reference 226 indicated in FIG. 2E) to decrease the aspect ratio in order to avoid the problem of poor step coverage and voids formation in the subsequently formed conductive layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for fabricating a semiconductor device, comprising:
    forming a trench in a substrate;
    performing a first thermal treatment process in a nitrogen-contaming ambient to remove a first native oxide layer comprising silicon dioxide formed on the surface of the trench;
    forming a buffer layer in the trench;
    performing a second thermal treatment process in a nitrogen-containing ambient to remove a second native oxide layer formed on the surface of the buffer layer, wherein a heating temperature of the first thermal treatment process and the second thermal treatment process is in a range of 700-1000° C.; and
    forming the conductive layer to fully fill the trench.

2. The method for fabricating the semiconductor device according to claim 1, wherein the first and the second thermal treatment processes are rapid thermal anneal process.

3. The method for fabricating the semiconductor device according to claim 1, wherein a heating time of the first thermal treatment process and the second thermal treatment process is in a range of about 30 -90 seconds.

4. The method for fabricating the semiconductor device according to claim 1, wherein a material of the conductive layer comprises doped polysilicon.

5. The method for fabricating the semiconductor device according to claim 1, wherein the step of forming the conductive layer comprises performing chemical vapor deposition (CVD).

6. The method for fabricating the semiconductor device according to claim 1, wherein a material constituting the buffer layer comprises undoped polysilicon.

* * * * *